United States Patent
Lee et al.

(10) Patent No.: US 12,463,646 B2
(45) Date of Patent: Nov. 4, 2025

(54) SEMICONDUCTOR DEVICE

(71) Applicant: Samsung Electronics Co., Ltd., Suwon-si (KR)

(72) Inventors: Mingyu Lee, Suwon-si (KR); Seungjin Park, Suwon-si (KR); Doobock Lee, Suwon-si (KR); Youngchul Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/487,448

(22) Filed: Oct. 16, 2023

(65) Prior Publication Data
US 2024/0356553 A1  Oct. 24, 2024

(30) Foreign Application Priority Data
Apr. 20, 2023  (KR) .................. 10-2023-0052250

(51) Int. Cl.
*H03K 19/0185* (2006.01)
*H03K 3/356* (2006.01)
*H03K 17/22* (2006.01)
*H03K 19/003* (2006.01)

(52) U.S. Cl.
CPC ........ *H03K 19/018521* (2013.01); *H03K 3/356113* (2013.01); *H03K 17/223* (2013.01); *H03K 19/00384* (2013.01)

(58) Field of Classification Search
None
See application file for complete search history.

(56) References Cited

U.S. PATENT DOCUMENTS

| | | | |
|---|---|---|---|
| 6,894,529 B1* | 5/2005 | Chong | H03K 19/0005 326/86 |
| 7,719,307 B2 | 5/2010 | Lee | |
| 7,906,986 B2 | 3/2011 | Lee | |
| 9,264,263 B2 | 2/2016 | Hafizi et al. | |
| 10,673,434 B2* | 6/2020 | Mathur | G11C 7/1051 |
| 10,707,876 B1 | 7/2020 | Yim et al. | |
| 10,748,585 B2 | 8/2020 | Choi | |
| 11,152,045 B2* | 10/2021 | Cho | H03K 19/018507 |
| 11,309,004 B2 | 4/2022 | Agrawal et al. | |
| 2005/0242830 A1 | 11/2005 | Humphrey et al. | |
| 2009/0238012 A1 | 9/2009 | Tatapudi et al. | |

FOREIGN PATENT DOCUMENTS

KR  20140077588 A  6/2014

* cited by examiner

*Primary Examiner* — Jeffrey S Zweizig
(74) *Attorney, Agent, or Firm* — Wolf, Greenfield & Sacks, P.C.

(57) ABSTRACT

A semiconductor device includes a first power node configured to supply a first power supply voltage, a pull-up circuit electrically connected between the first power node and an output node that is configured to output a signal, and a controller configured to output a pull-up control code to the pull-up circuit. The pull-up circuit includes a plurality of unit circuits electrically connected to each other in parallel between the first power node and the output node, and the plurality of unit circuits include a first unit circuit and a second unit circuit. The number of current paths provided by the first unit circuit between the first power node and the output node is different from the number of current paths provided by the second unit circuit between the first power node and the output node.

20 Claims, 12 Drawing Sheets

SEMICONDUCTOR DEVICE

CROSS-REFERENCE TO RELATED APPLICATION(S)

This application claims the benefit under 35 USC 119 (a) of Korean Patent Application No. 10-2023-0052250 filed on Apr. 20, 2023 in the Korean Intellectual Property Office, the entire disclosure of which is incorporated herein by reference for all purposes.

BACKGROUND

The present inventive concept relates to a semiconductor device.

A semiconductor device includes a plurality of semiconductor elements, and some of the plurality of semiconductor elements may provide drivers and receivers for transmitting and receiving signals to and from other external semiconductor devices. The driver is connected to a pad that outputs a signal, and may include a function of adjusting the strength of the output signal. However, in a driver implemented with a function to adjust the strength of an output signal, a problem is present in which the input/output capacitance and circuit area of the driver increases, or there may be a resistance mismatch, which is a difference between the resistance determined by ZQ calibration and the actual resistance of the driver.

SUMMARY

Example embodiments provide a semiconductor device including a driver implemented to significantly reduce an increase in input/output capacitance and a circuit area, reduce a resistance mismatch, and/or simultaneously adjusting strength of an output signal.

According to example embodiments, a semiconductor device includes a first power node configured to supply a first power supply voltage, an output node configured to output a signal to an output pad, and a plurality of unit circuits electrically connected to the output node and electrically connected to each other in parallel between the first power node and the output node. Each of the plurality of unit circuits includes a plurality of switch elements electrically connected between the first power node and the output pad and that are configured to be turned on and off by an N-bit control code, where N is a natural number equal to or greater than 2. In a first unit circuit of the plurality of unit circuits, at least two of the plurality of switch elements are connected to each other in parallel to provide N+1 current paths between the first power node and the output node. A first current path among the N+1 current paths is configured to have a smallest current to flow, and the (N+1)th current path is configured to have a largest current to flow. While the signal is output by the output node, at least one of the (N+1)th current paths and the first current path in the first unit circuit are blocked.

According to example embodiments, a semiconductor device includes a pull-up circuit electrically connected between a first power node that is configured to supply a first power supply voltage and an output node that is configured to output a signal, a pull-down circuit electrically connected between a second power node that is configured to supply a second power supply voltage lower than the first power supply voltage and the output node, and a controller configured to output an N-bit control code to the pull-up circuit and the pull-down circuit, where N is a natural number greater than or equal to 2. The pull-up circuit includes a plurality of pull-up unit circuits electrically connected to each other in parallel between the first power node and the output node, the controller is configured to output the N-bit control code or a shift code obtained by code-shifting the N-bit control code to a first pull-up unit circuit among the plurality of pull-up unit circuits, and the controller is configured to output an N−1 bit correction control code that is obtained by removing a least significant bit from the N-bit control code or is configured to output the N-bit control code to at least one second pull-up unit circuit different from the first pull-up unit circuit.

According to example embodiments, a semiconductor device includes a pull-up circuit electrically connected between a first power node that is configured to supply a first power supply voltage and an output node configured to output a signal, and a controller configured to output a pull-up control code to the pull-up circuit. The pull-up circuit includes a plurality of unit circuits electrically connected to each other in parallel between the first power node and the output node. The plurality of unit circuits include a first unit circuit and a second unit circuit, and a number of current paths provided by the first unit circuit between the first power node and the output node is different from a number of current paths provided by the second unit circuit between the first power node and the output node.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
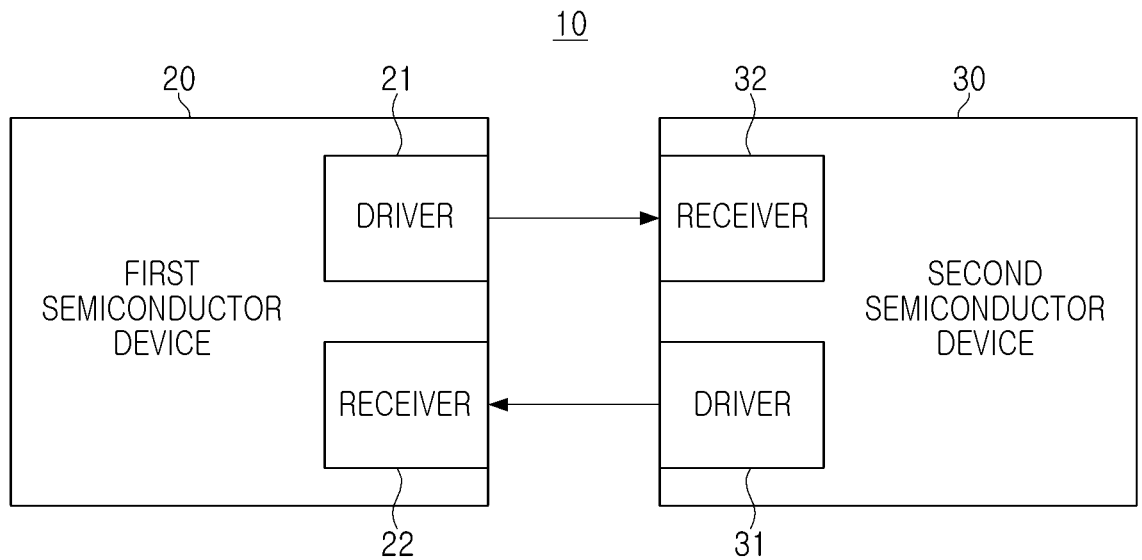
FIG. 1 is a schematic block diagram of a system including a semiconductor device according to example embodiments.

FIG. 1 is a block diagram schematically illustrating a system including a semiconductor device according to example embodiments.

Referring to FIG. 1, a system 10 according to example embodiments may include a first semiconductor device 20 and a second semiconductor device 30 that exchange signals. The first semiconductor device 20 and the second semiconductor device 30 may include drivers 21 and 31 outputting signals and receivers 22 and 32 receiving signals, respectively.

For example, in the system 10 according to example embodiments illustrated in FIG. 1, The first semiconductor device 20 is a host device such as an application processor, a central processing unit, a system-on-chip, and the like, and the second semiconductor device 30 may be a memory device that stores data. In this case, the driver 21 of the first semiconductor device 20 may output a data signal including data to be stored in the second semiconductor device 30, a control signal required for the operation of the second semiconductor device 30, a clock signal, and the like. On the other hand, the second semiconductor device 30 may read internally stored data based on a control signal and a clock signal, and a data signal including data may be output to the first semiconductor device 20 by the driver 31 of the second semiconductor device 30.

A signal transmitted between the first semiconductor device 20 and the second semiconductor device 30 may be a signal that transitions between two or more voltage levels. The voltage level of the signal may be determined by the operation of the pull-up circuit and the pull-down circuit included in the drivers 21 and 31. As an example, the pull-up circuit may be a circuit connected between an output node from which a signal is output and a first power node that supplies a first power supply voltage, and the pull-down circuit may be a circuit connected between an output node and a second power node supplying a second power supply voltage lower than the first power supply voltage. Each of the first semiconductor device 20 and the second semiconductor device 30 internally generates a control code for controlling the pull-up circuit and the pull-down circuit, and the drivers 21 and 31 output the control code by the control code. The voltage level of the signal may be determined.

To improve signal integrity and increase an eye margin transmitted between the first semiconductor device 20 and the second semiconductor device 30, the first semiconductor device 20 and the second semiconductor device 30 are provided with a pull-up circuit and/or a pull-down circuit. A ZQ calibration operation may be executed in at least one of the semiconductor devices 30. The ZQ calibration operation may include an operation of adjusting the resistance of the drivers 21 and 31 to minimize signal reflection due to mismatch in resistance. In detail, in the ZQ calibration operation, the resistance of the pull-up circuit and/or the pull-down circuit included in the drivers 21 and 31 may be adjusted, and accordingly, the strength of signals output from the drivers 21 and 31 may vary based on the adjustment. As discussed herein, the strength of signals may be the power, voltage, or current of the signal.

Each of the pull-up circuit and the pull-down circuit may include a plurality of switch elements connected in parallel between the power node and the output node that provide current paths through which currents of different magnitudes flow. Also, each of the pull-up circuit and the pull-down circuit may include a means for adjusting resistance.

As an example, when a control code of N bits (where N is a natural number greater than or equal to 2) is generated, the pull-up and pull-down circuits of the drivers 21 and 31 may be configured to provide M more than N current paths. Also, each of the pull-up circuit and the pull-down circuit may include a plurality of unit circuits connected to each other in parallel. In example embodiments, resistance is adjusted by selecting N current paths among M current paths by a shift code generated by code-shifting a control code, or actually inputting a control code among a plurality of unit circuits. Resistance may be adjusted by changing the number of received unit circuits. Therefore, while minimizing the increase in the circuit area of the drivers 21 and 31 and the input/output capacitance existing at the output node, it is possible to reduce resistance mismatch appearing in the drivers 21 and 31 due to code shift at the same time.

Figure 2:
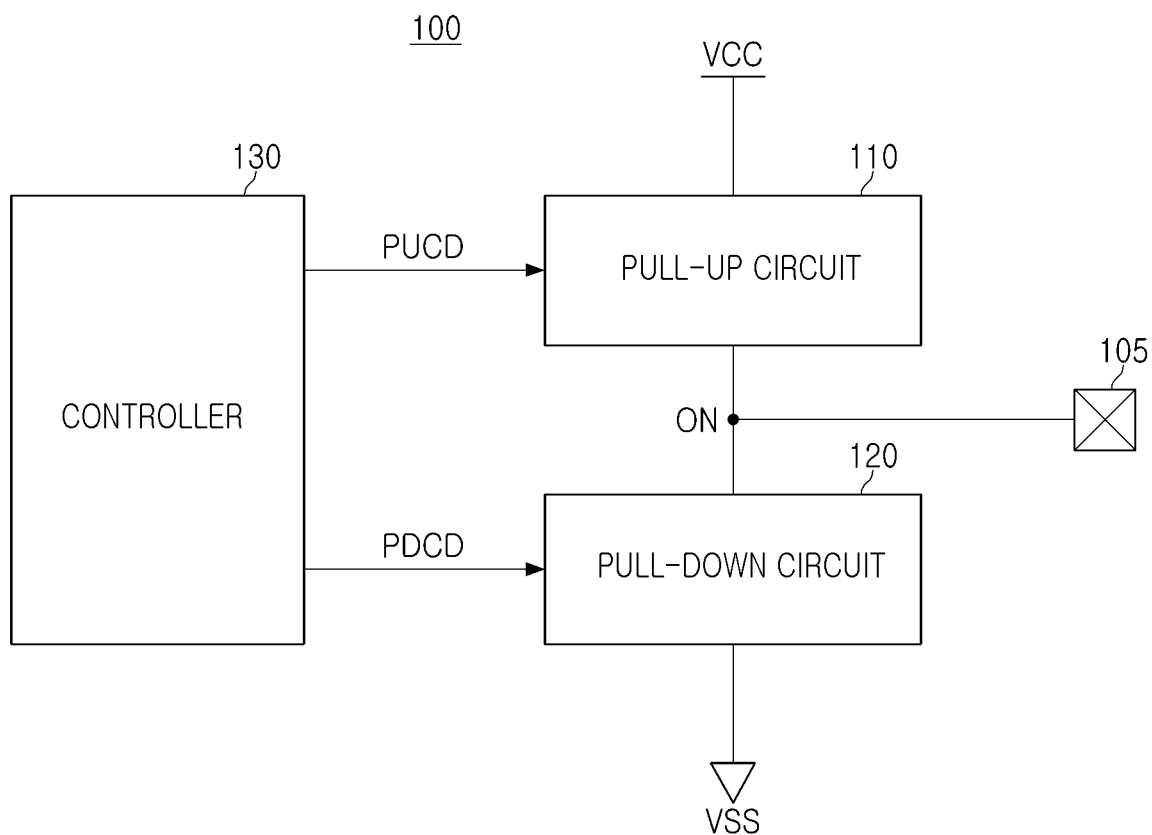
FIG. 2 is a schematic block diagram of a semiconductor device according to example embodiments.

FIG. 2 is a schematic block diagram of a semiconductor device according to example embodiments.

Referring to FIG. 2, the semiconductor device 100 according to example embodiments may include a driver outputting a signal to an output pad 105 and a controller 130 controlling the driver. The driver may include an output node (ON) connected to the output pad 105, a pull-up circuit 110 connected between a first power node supplying a first power supply voltage VCC and an output node ON, a pull-down circuit 120 connected between the second power node supplying the second power supply voltage VSS and the output node ON, and the like. The voltage level of the first power supply voltage VCC may be higher than the voltage level of the second power supply voltage VSS.

Each of the pull-up circuit 110 and the pull-down circuit 120 may include a plurality of switch elements providing a plurality of current paths arranged in parallel with each other. For example, a plurality of current paths provided by the pull-up circuit 110 may be connected in parallel between the first power node and the output node ON. Also, the plurality of current paths may flow currents of different magnitudes. For example, the magnitude of the current flowing through the first current path may be smaller than the magnitude of the current flowing through the second current path.

The controller 130 may transmit the pull-up control code PUCD to the pull-up circuit 110 and the pull-down control code PDCD to the pull-down circuit 120. Some of the plurality of current paths provided by the pull-up circuit 110 are activated by the pull-up control code (PUCD), and some of the plurality of current paths provided by the pull-down circuit 120 are activated by the pull-down control code (PDCD). Therefore, the resistances of the pull-up circuit 110 and the pull-down circuit 120 are determined by the pull-up control code PUCD and the pull-down control code PDCD, and accordingly, the strength of the output signal may be changed at the output node (ON).

For example, each of the pull-up circuit 110 and the pull-down circuit 120 may include a plurality of unit circuits. The controller 130 may determine the number of unit circuits that actually receive and operate the pull-up control code (PUCD) and pull-down control code (PDCD) from the pull-up circuit 110 and the pull-down circuit 120, respectively.

For example, when the number of unit circuits that operate by receiving the pull-up control code (PUCD) from the pull-up circuit 110 increases, resistance of the pull-up circuit 110 may decrease. On the other hand, if the number of unit circuits that receive the pull-up control code PUCD is reduced, the resistance of the pull-up circuit 110 may increase. In this manner, the controller 130 may change the number of unit circuits actually operating in the pull-up circuit 110 and the pull-down circuit 120, respectively, thereby adjusting resistance of each of the pull-up circuit 110 and the pull-down circuit 120 and adjusting the output signal therefrom.

Also, the controller 130 may adjust the resistance of the pull-up circuit 110 and the pull-down circuit 120 by changing the pull-up control code PUCD and the pull-down control code PDCD. For example, when the controller 130 outputs a pull-up control code (PUCD) so that some of the plurality of current paths provided by the pull-up circuit 110 are activated, the resistance of the pull-up circuit 110 may be changed.

Figure 3:
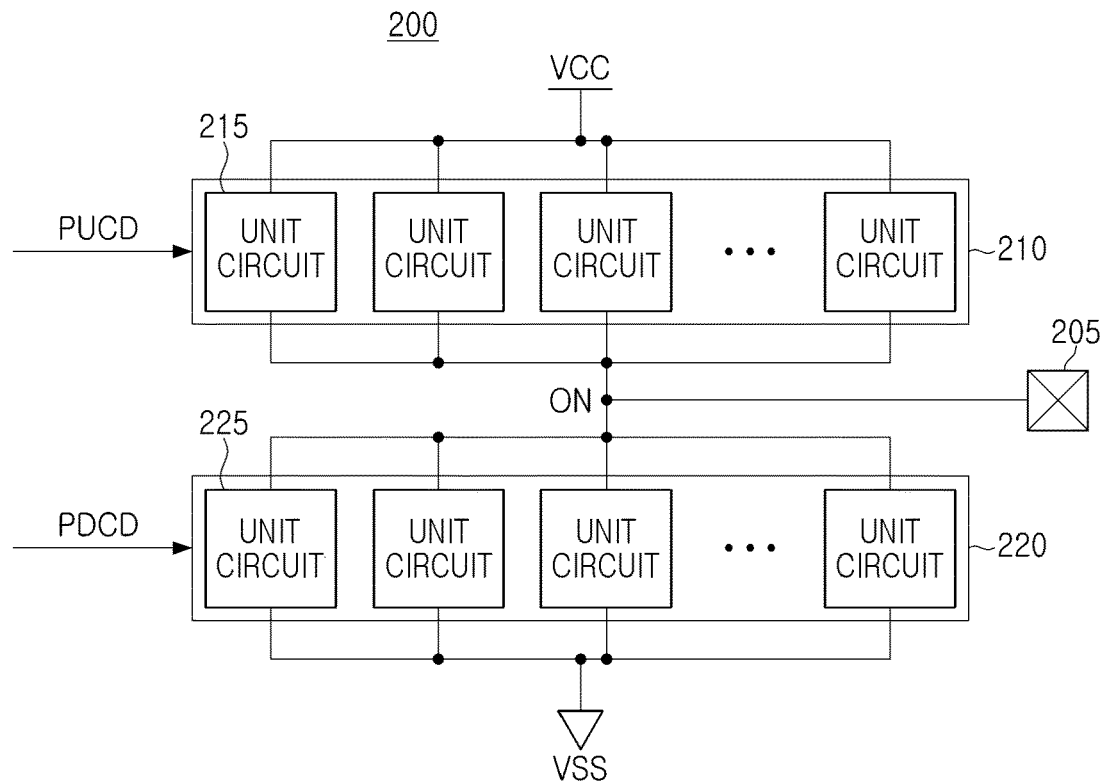
FIGS. 3 to 5 are diagrams provided to describe a driver included in a semiconductor device according to example embodiments.
Figure 4:
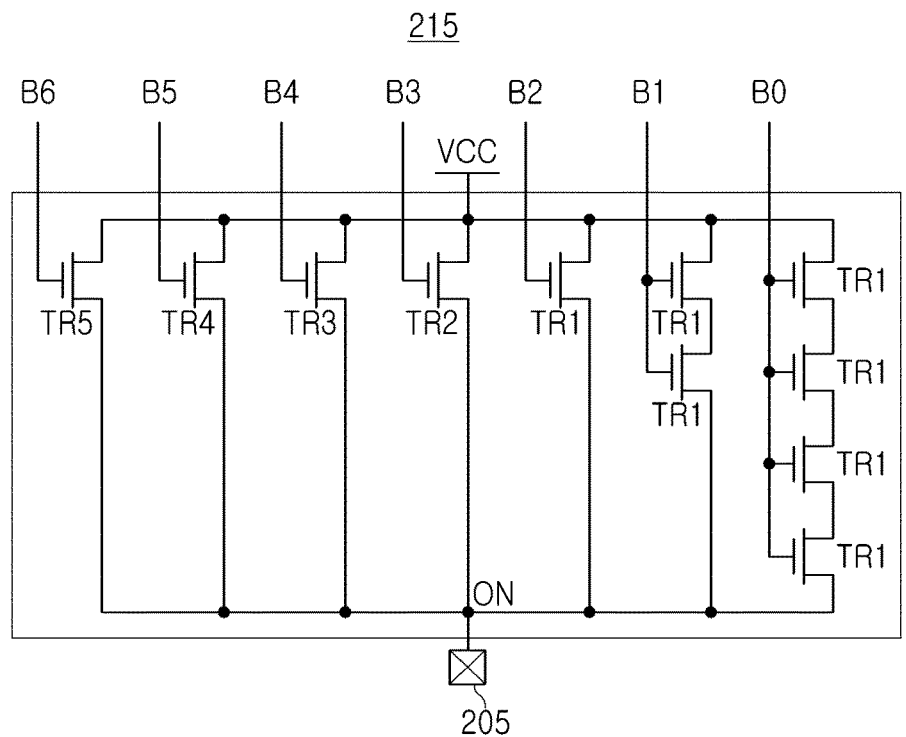
Figure 5:
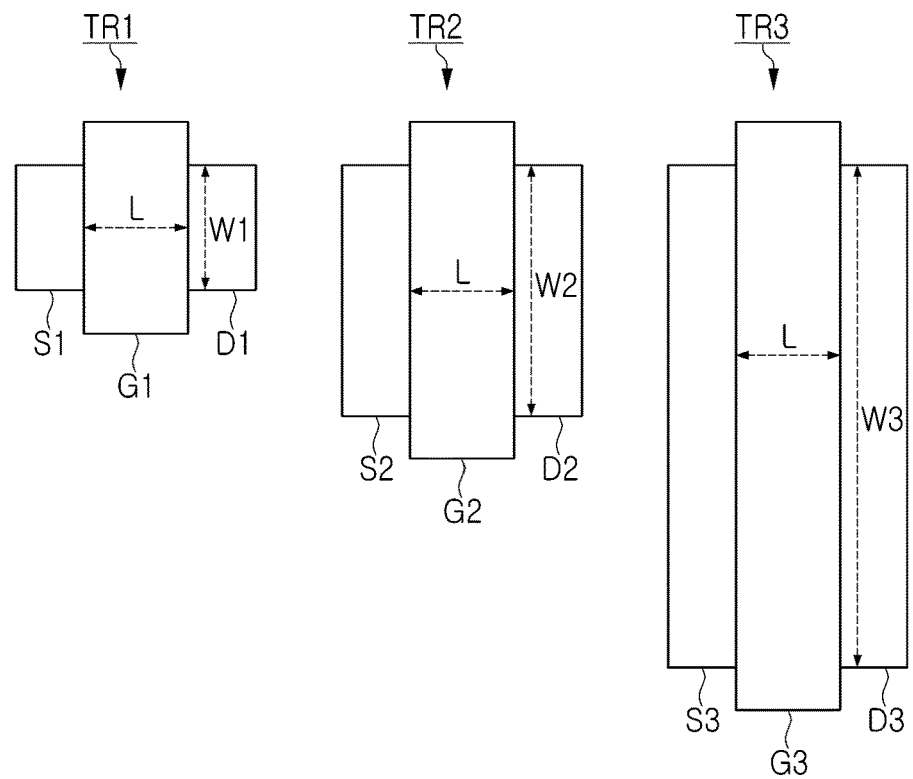

FIGS. 3 to 5 are views provided to describe a driver included in a semiconductor device according to example embodiments.

Referring first to FIG. 3, the driver of a semiconductor device 200 may include a pull-up circuit 210 and a pull-down circuit 220. The pull-up circuit 210 is connected between the first power node supplying the first power supply voltage VCC and the output node ON, and is electrically connected to the pull-down circuit 220 that is supplied the second power supply voltage VSS. The pull-down circuit 220 may be connected between the second power node that supplies the second power supply voltage VSS and the output node (ON). The output node (ON) may be connected to the output pad 205.

As illustrated in FIG. 3, the pull-up circuit 210 may include a plurality of pull-up unit circuits 215 connected to each other in parallel between the first power node and the output node ON. Each of the plurality of pull-up unit circuits 215 may be defined as a pull-up unit circuit. On the other hand, the pull-down circuit 220 may include a plurality of pull-down unit circuits 225 connected to each other in parallel between the second power node and the output node ON. Each of the plurality of pull-down unit circuits 225 may be defined as a pull-down unit circuit.

The pull-up control code PUCD output by the controller may be input to at least one of the plurality of pull-up unit circuits 215 included in the pull-up circuit 210. Similarly, the pull-down control code PDCD may be input to at least one of the plurality of pull-down unit circuits 225.

The controller may increase or decrease the resistance of the pull-up circuit 210 by adjusting the number of pull-up unit circuits 215 to which the pull-up control code PUCD is input. Also, the controller may increase or decrease the resistance of the pull-down circuit 220 by adjusting the number of pull-down unit circuits 225 to which the pull-down control code PDCD is input. As such, in the semiconductor device 200 according to example embodiments, the resistance of each of the pull-up circuit 210 and the pull-down circuit 220 is individually adjusted by changing the number of pull-up unit circuits 215 and/or pull-down unit circuits 225 that actually receive control codes and operate, in each of the pull-up circuit 210 and the pull-down circuit 220. Therefore, the strength of the signal output through the output pad 205 may be controlled.

FIG. 4 is a circuit diagram illustrating the pull-up unit circuit 215 included in the pull-up circuit 210, as an example. Referring to FIG. 4, a pull-up unit circuit 215 includes a plurality of power nodes connected between a first power node supplying a first power supply voltage VCC and an output node ON connected to an output pad 205. Switch elements TR1 to TR5 may be included. Each of the plurality of switch elements TR1 to TR5 is illustrated as being an NMOS transistor, but may be implemented as a PMOS transistor or as other circuits. Five switch elements TR1 to TR5 are illustrated as a non-limiting example.

The pull-down unit circuit 225 may also be implemented with a structure similar to the circuit diagram illustrated in FIG. 4. For example, the pull-down unit circuit 225 may include a plurality of switch elements connected between a second power node supplying the second power supply voltage VSS and the output node ON. The number of switch elements included in the pull-down unit circuit 225 may be the same as or different from the number of switch elements TR1 to TR5 included in the pull-up unit circuit 215.

At least some of the plurality of switch elements TR1 to TR5 are connected to each other in parallel, and thus a plurality of current paths may be formed between the first power node and the output node ON. In the example embodiment illustrated in FIG. 4, one pull-up unit circuit 215 may provide first through seventh current paths. The first to seventh current paths may be activated or deactivated by the first to seventh control signals B0 to B6.

In example embodiments illustrated in FIG. 4, the first current path is provided by four first switch elements, the second current path is provided by two second switch elements, and the third current path may be provided by a third switch element. On the other hand, the fourth current path is provided by the fourth switch element, the fifth current path is provided by the fifth switch element, the sixth current path is provided by the sixth switch element, and the seventh current path is provided by the fifth switch element.

At least some of the plurality of switch elements TR1 to TR5 may be implemented as transistors having different aspect ratios. Referring to FIG. 5, the first transistor TR1 may include a first gate structure G1, a first source region S1 and a first drain region D1. The first aspect ratio of the first transistor TR1 may be determined by the channel length L and the first channel width W1 determined according to the width of the first gate structure G1.

For example, as shown in FIG. 4, four first transistors TR1 having a first aspect ratio are connected in series to provide a first current path, and two first transistors TR1 may be connected in series to provide a second current path. On the other hand, a third current path may be provided by one first transistor TR1. Accordingly, the strength of the current flowing through the first current path may be about ½ of the strength of the current flowing through the second current path, and the strength of the current flowing through the third current path may be about twice the strength of the current flowing through the second current path.

Referring to FIG. 5, the aspect ratio of the second transistor TR2 may be twice that of the first transistor TR1. The second transistor TR2 includes a second gate structure G2, a second source region S2, and a second drain region D2, and a channel length L may be the same as that of the first transistor TR1. However, the second channel width W2 of the second transistor TR2 may be twice the first channel width W1. Therefore, the strength of the current flowing through the fourth current path provided by the second transistor TR2 may be twice the strength of the current flowing through the third current path provided by the first transistor TR1.

On the other hand, the aspect ratio of the third transistor TR3 may be four times that of the first transistor TR1. Referring to FIG. 5, the third transistor TR3 includes a third gate structure G3, a third source region S3, and a third drain region D3. The channel length L may be the same as that of the first transistor TR1 and the second transistor TR2. The third channel width W3 of the third transistor TR3 may be four times the first channel width W1 and twice the second channel width W2. Therefore, the strength of the current flowing through the fifth current path provided by the third transistor TR3 may be four times the strength of the current flowing through the third current path.

The aspect ratio of the fourth transistor TR4 may be eight times that of the first transistor TR1. In this case, the strength of the current flowing through the sixth current path provided by the fourth transistor TR4 may be eight times the strength of the current flowing through the third current path.

The aspect ratio of the fifth transistor TR5 may be sixteen times the aspect ratio of the first transistor TR1. Accordingly, the strength of the current flowing through the seventh current path provided by the fifth transistor TR5 may be 16 times the strength of the current flowing through the third current path.

However, the structure of the pull-up unit circuit 215 is not limited to the circuit illustrated in FIG. 4. For example, the first to seventh current paths may be configured with seven transistors having different aspect ratios. In this case, each of the first to seventh current paths includes one transistor, and the aspect ratio of the transistor may double from the first current path to the seventh current path.

As described above, the pull-up control code (PUCD) may be input to the pull-up unit circuit 215. The pull-up control code (PUCD) may include data of 2 bits or more. Each value of the first to seventh control signals B0 to B6 for determining whether to activate each of the first to seventh current paths included in the pull-up unit circuit 215 may be determined by the pull-up control code (PUCD).

In example embodiments, the controller adjusts a method of allocating data of 2 bits or more included in the pull-up control code (PUCD) to the first to seventh control signals B0-B6, thereby controlling the pull-up. The amount of current flowing through the pull-up unit circuit 215 may be adjusted. Therefore, the resistance value of the pull-up unit circuit 215 may vary depending on how the controller determines the value of each of the first to seventh control signals B0-B6 based on the pull-up control code PUCD. Therefore, the strength of the signal output to the output pad 205 may be adjusted. For example, according to the number of bits of the pull-up control code (PUCD), the value of each of the bit digits included in the pull-up control code (PUCD), whether the pull-up control code (PUCD) is code shifted, and the like; the respective values of the first through seventh control signals B0-B6 may be determined.

Hereinafter, for convenience of description, it is assumed that the pull-up control code (PUCD) includes 6-bit data. In example embodiments, the resistance value of the pull-up unit circuit 215 may vary depending on whether the controller activates a code shift that includes a 1-bit multiplier process.

For example, when the code shift is not activated, each of six bits included in the pull-up control code PUCD may be allocated to the first to sixth control signals B0 to B5. For example, the first control signal B0 may be determined by the first bit, which is the least significant bit, of the pull-up control code PUCD, and the sixth control signal B5 may be determined by the sixth bit, which is the most significant bit. When the first bit of the pull-up control code PUCD is 1, the four first transistors TR1 included in the first current path are turned on, and the sixth bit of the pull-up control code PUCD is 0. If this is the case, the fourth transistor TR4 included in the sixth current path may be turned off.

When the code shift is activated, each of 6 bits included in the pull-up control code PUCD may be allocated to the second to seventh control signals B1 to B6. At this time, the first control signal B0 is set to 0, and all four first transistors TR1 providing the first current path may be turned off. When the most significant bit of the pull-up control code PUCD is 1, the fifth transistor TR5 providing the seventh current path is turned on, and at this time, the four first transistors providing the first current path TR1 may be turned off.

In this manner, the controller may set the resistance of the pull-up unit circuit 215 differently with the same pull-up control code (PUCD) by controlling whether or not to activate the code shift. When the number of bits that may be multiplied in code shift increases, a range between a minimum resistance value and a maximum resistance value that may be set by one pull-up unit circuit 215 may widen.

On the other hand, as the number of bits multiplied in code shift increases, a difference between a target resistance value to be set in the pull-up unit circuit 215 and a resistance value actually possessed by the pull-up unit circuit 215 may increase. For example, if the pull-up unit circuit 215 receiving the pull-up control code (PUCD) to which code shift is not applied has a resistance value of 300Ω, the controller applies the code shift to the pull-up control code (PUCD). By inputting the shift code applied to the pull-up unit circuit 215, the resistance value of the pull-up unit circuit 215 may be reduced to 75Ω. However, in reality, the resistance value of the pull-up unit circuit 215 may have a value smaller than the target resistance value of 75Ω.

Accordingly, in example embodiments, the number of bit digits capable of code shifting may be limited. However, when the number of bit digits capable of code shifting is limited, the types of resistance values that may be set in one pull-up unit circuit 215 are limited, and as a result, it may be difficult to sufficiently adjust the strength of an output signal. In example embodiments, in addition to code shift, by a method of changing the number of actually operating unit circuits among a plurality of pull-up unit circuits 215 and a plurality of pull-down unit circuits 225 as described with reference to FIG. 3, the strength of the output signal may be adjusted more diversely.

As described above, when changing a large number of bit digits in a pull-up control code (PUCD) and/or a pull-down control code (PDCD) in a code shift manner, resistance mismatch in the pull-up circuit 210 and/or the pull-down circuit 220 may become severe. On the other hand, when the number of pull-up unit circuits 215 and the number of pull-down unit circuits 225 are adjusted, the circuit area of the driver may increase along with the input/output capacitance of the output pad 205.

For example, when the pull-up circuit 210 includes only one pull-up unit circuit 215, by applying a code shift for three bit digits, the resistance value of the pull-up unit circuit 215 may be adjusted to ⅛ times the basic resistance value set in the ZQ calibration operation. However, in this case, resistance mismatch due to code shift may be severe since only one pull-up unit circuit 215 is included.

Conversely, to adjust the resistance value of the pull-up circuit 210 to ⅛ times the basic resistance value without code shift, eight or more pull-up unit circuits 215 may be included in the pull-up circuit 210. In this case, the resistance mismatch may be minimized, while the input/output capacitance of the output pad 205 and the circuit area of the driver may increase due to the increase in the number of pull-up unit circuits 215.

In example embodiments, by applying code shift to a limited number of bit digits and appropriately limiting the number of pull-up unit circuits 215 and the number of pull-down unit circuits 225, input/output capacitance and driver resistance mismatch may be effectively reduced while minimizing an increase in the circuit area of. As an example, by applying code shift only for one bit digit and including four pull-up unit circuits 215 in the pull-up circuit 210, the resistance may be adjusted up to ¼ times the basic resistance value. The pull-up circuit 210 may be effectively implemented.

Figure 6:
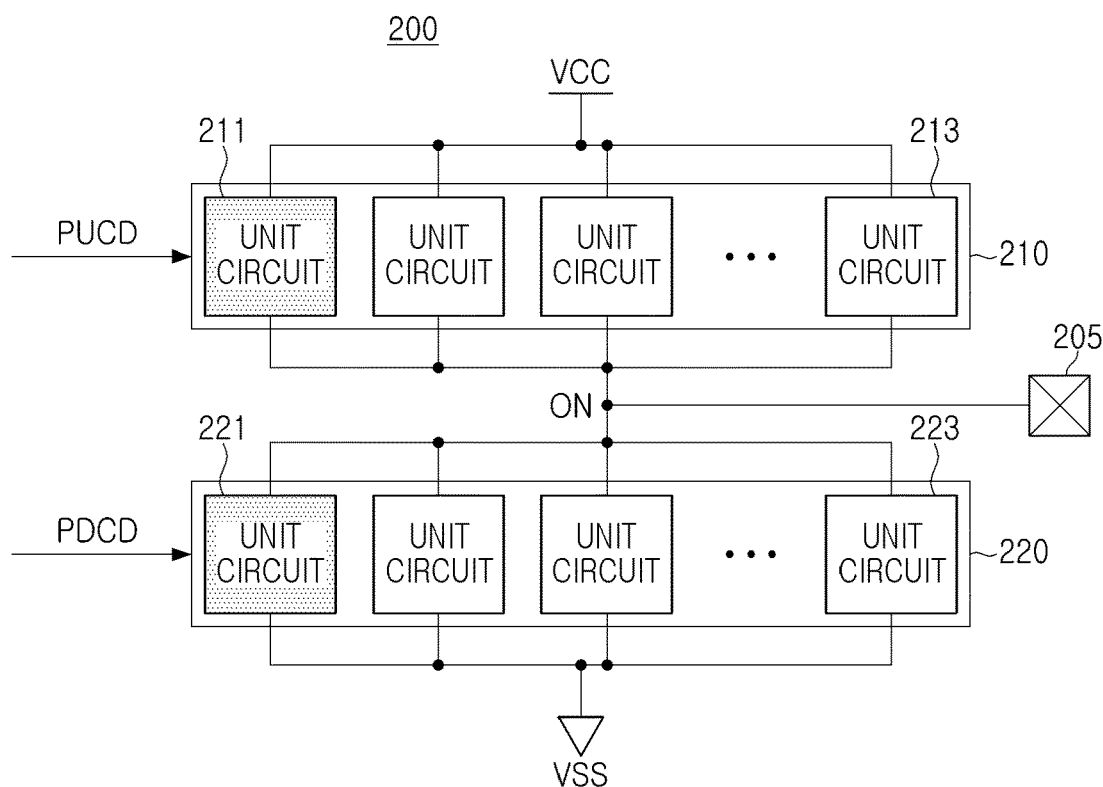
FIGS. 6 to 8 are diagrams illustrating the operation of a semiconductor device according to example embodiments.
Figure 7:
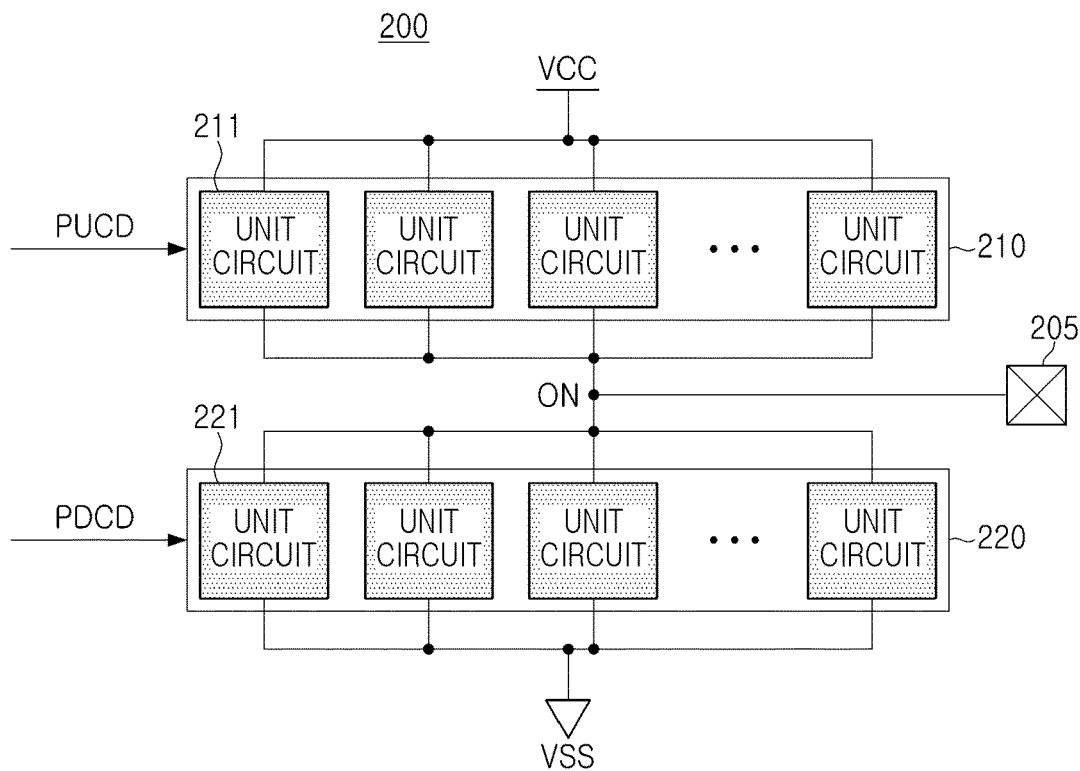
Figure 8:
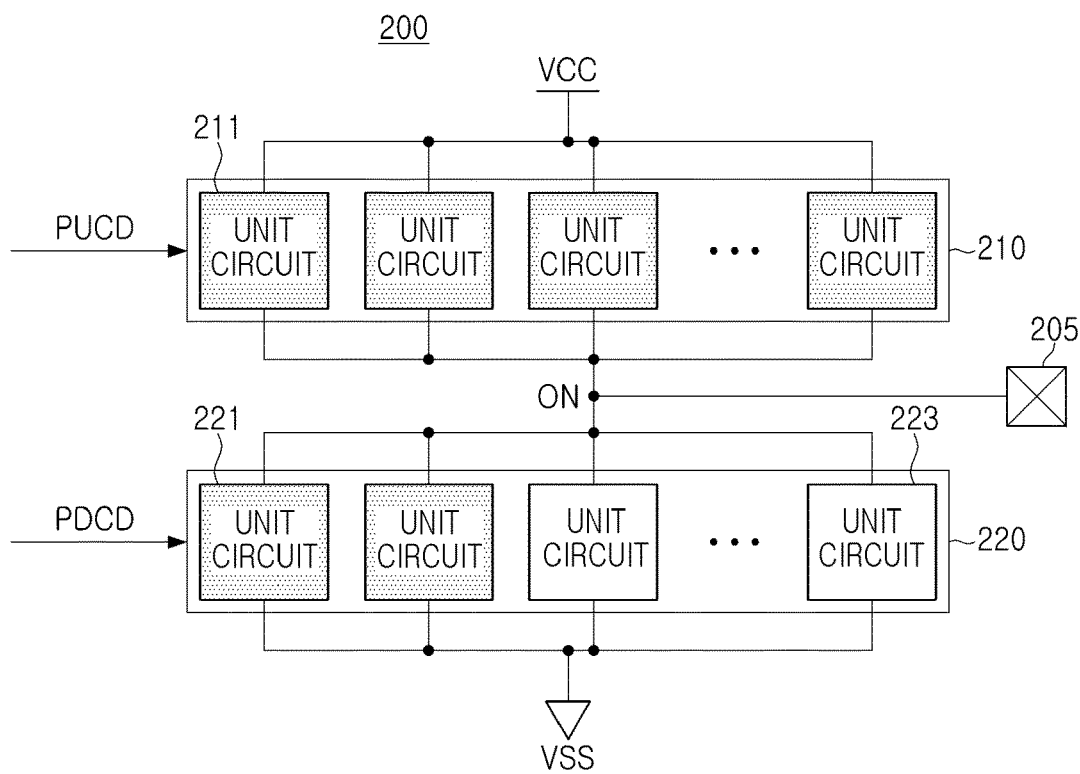

FIGS. 6 to 8 are diagrams illustrating the operation of a semiconductor device according to example embodiments.

In example embodiments described with reference to FIGS. 6 to 8, the semiconductor device 200 may adjust the strength of a signal output to the output pad 205 by changing the number of selected unit circuits 211 actually operating in the pull-up circuit 210 and the number of selected unit circuits 221 actually operating in the pull-down circuit 220. The selected unit circuits 211 and 221 may be unit circuits that actually receive a pull-up control code (PUCD) or a pull-down control code (PDCD), and the pull-up control code (PUCD) and the pull-down control code (PDCD) may not be input to the non-selected unit circuits 213 and 223.

In example embodiments illustrated in FIG. 6, the pull-up control code (PUCD) is input only to one selected unit circuit 211 in the pull-up circuit 210, and the pull-down control code PDCD may be input only to one selected unit circuit 221 in the pull-down circuit 220. Each of the pull-up control code (PUCD) and the pull-down control code (PDCD) may have a value determined in the ZQ calibration operation, and accordingly, the pull-up circuit 210 and the pull-down circuit 220 may provide the same resistance value as the target resistance value reflected in the ZQ calibration operation, respectively. The pull-up control code (PUCD) and the pull-down control code (PDCD) may include different data.

To increase the strength of the signal output to the output pad 205, the semiconductor device 200 may increase the number of selected unit circuits 211 and 221 to reduce the resistance value of each of the pull-up circuit 210 and the pull-down circuit 220. In example embodiments illustrated in FIG. 7, all unit circuits in each of the pull-up circuit 210 and the pull-down circuit 220 are determined as the selected unit circuits 211 and 221, and a pull-up control code (PUCD) or a pull-down control code (PDCD) may be input.

Assuming that the number of unit circuits included in the pull-up circuit 210 is A, in example embodiments illustrated in FIG. 7, the resistance of the pull-up circuit 210 may be reduced to 1/A times that of the example embodiment illustrated in FIG. 6. Similarly, assuming that B unit circuits are included in the pull-down circuit 220, in the example embodiment illustrated in FIG. 7, the resistance of the pull-down circuit 220 may be reduced to 1/B times that of the example embodiment illustrated in FIG. 6. Accordingly, the strength of the signal output to the output pad 205 may increase.

In example embodiments, if necessary, the number of selected unit circuits 211 in the pull-up circuit 210 and the number of selected unit circuits 221 in the pull-down circuit 220 may be determined differently from each other. Referring to FIG. 8, in the pull-up circuit 210, all unit circuits are determined as selected unit circuits 211, whereas in the pull-down circuit 220, only two unit circuits are selected unit circuits 221, and the rest may be determined by non-selected unit circuits 223.

On the other hand, as described above, in example embodiments, in addition to the method of changing the number of selected unit circuits 211 and 221 among a plurality of unit circuits, the strength of a signal output to the output pad 205 may also be adjusted by other methods. In an example, by a method of changing the amount of current flowing through each of the selected unit circuits 211 and 221 by executing the code shift of changing the number of bit digits of the pull-up control code (PUCD) and/or the pull-down control code (PDCD), the strength of the signal may be adjusted, which will be described below in more detail with reference to FIGS. 9 and 10.

Figure 9:
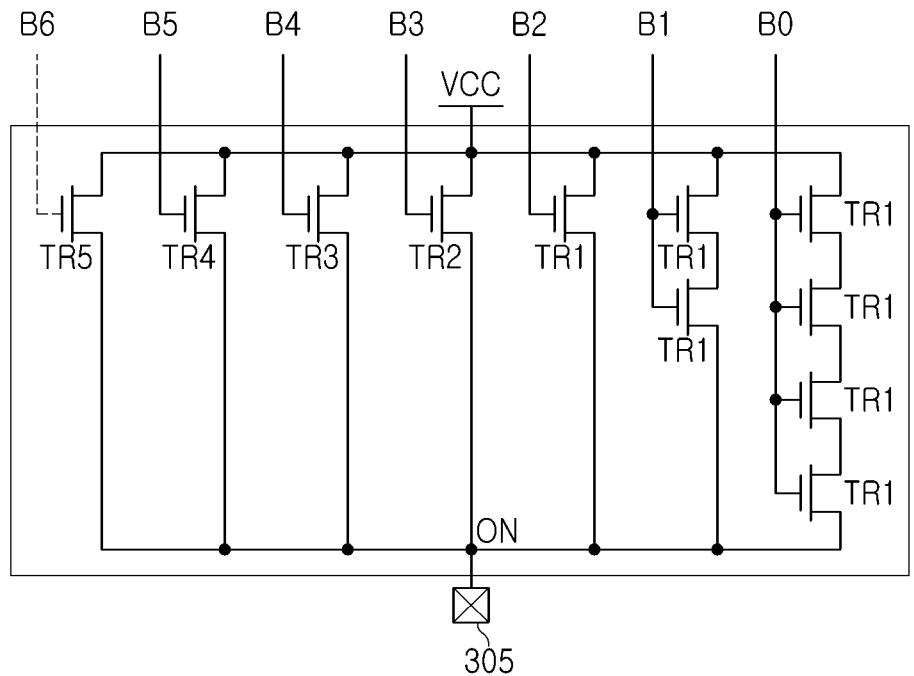
FIGS. 9 and 10 are diagrams illustrating the operation of a semiconductor device according to example embodiments.
Figure 10:
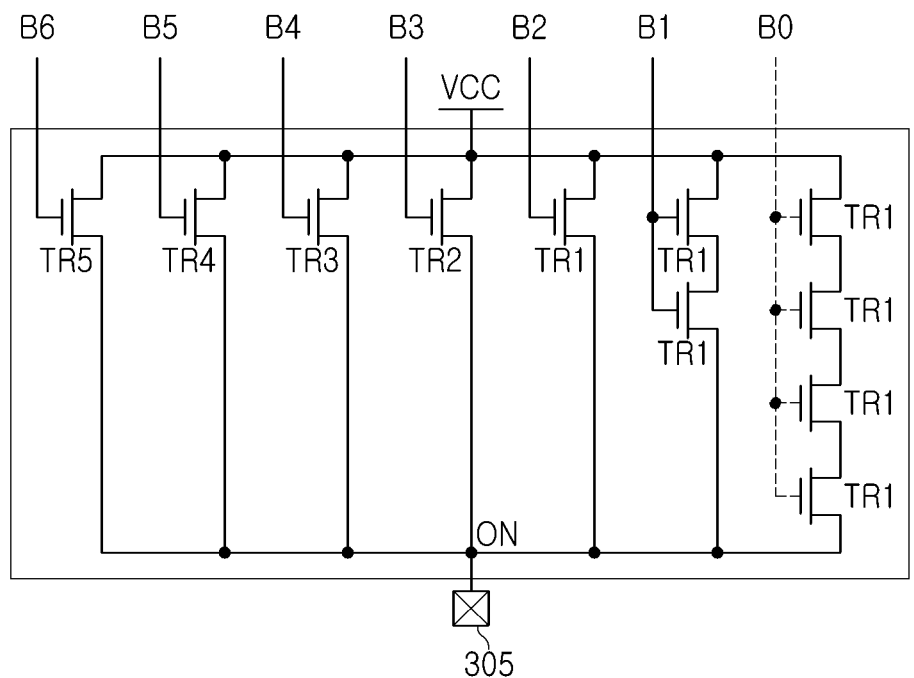

FIGS. 9 and 10 are diagrams illustrating the operation of a semiconductor device according to example embodiments.

FIGS. 9 and 10 are circuit diagrams illustrating one of a plurality of unit circuits included in a pull-up circuit in a driver of a semiconductor device according to example embodiments. In detail, the circuits illustrated in FIGS. 9 and 10 may be one pull-up unit circuit 300 included in the pull-up circuit.

The pull-up unit circuit 300 may include a plurality of switch elements TR1 to TR5 connected between a first power node supplying a first power supply voltage VCC and an output node ON, and the output node ON may be connected to an output pad 305 through which a signal is output to the outside of the pull-up unit circuit 300. The plurality of switch elements TR1 to TR5 provide current paths connected to each other in parallel, and the amount of current provided by each of the current paths may be different from each other. In the example embodiment described with reference to FIGS. 9 and 10, the plurality of switch elements TR1 to TR5 included in the pull-up unit circuit 300 provide first to seventh current paths, the amount of current provided by the first current path is the smallest, and the amount of current provided by the seventh current path may be the largest.

Accordingly, the amount of current flowing through the pull-up unit circuit 300 may vary according to current paths selected to receive the pull-up control code from among the first to seventh current paths. As a result, the resistance value of the pull-up unit circuit 300 may decrease, and the strength of the signal output to the output pad 305 may increase.

Current paths selected through which the pull-up control code is input from among the first to seventh current paths may vary depending on whether the controller of the semiconductor device applies a code shift to the pull-up control code. FIG. 9 illustrates a case where the pull-up control code is input to the pull-up unit circuit 300 as it is without code shift, and FIG. 10 illustrates the shift code generated by code-shifting the pull-up control code by 1 bit. A case of input to the pull-up unit circuit 300 may be indicated. In example embodiments described with reference to FIGS. 9 and 10, the pull-up control code may include 6-bit data.

When code shift is not applied to the pull-up control code, values of the first to sixth control signals B0 to B5 may be determined by 6 bits included in the pull-up control code. For example, the first control signal B0 may be determined by the first bit, which is the least significant bit of the pull-up control code, and the sixth control signal B5 may be determined by the sixth bit, which is the most significant bit. In detail, the first to sixth control signals B0-B5 may be sequentially matched to six bits included in the pull-up control code. The value of the seventh control signal B6 is determined to be 0, the fifth transistor TR5 is turned off, and current may not flow through the seventh current path.

Since the pull-up control code includes 6 bits of data and the pull-up unit circuit 300 provides the first to seventh current paths, a code shift of 1 bit may be applied to the pull-up control code. For example, when the current paths provided by the pull-up unit circuit 300 increase or the number of bits of the pull-up control code is less than 6 bits, a code shift of 2 bits or more may be applied to the pull-up control code. Referring to FIG. 10, a shift code to which a code shift of 1 bit is applied is input to the pull-up unit circuit, and at this time, when the value of the first control signal B0 is determined to be 0, the four first transistors TR1 providing the first current path may be turned off.

As an example, assuming that the pull-up control code is [101101], the values of the first to seventh control signals B0-B6 according to whether the code shift is activated may be as illustrated in Table 1 below. As illustrated in Table 1, when code shift is applied, six bits included in the pull-up control code are sequentially matched to the second to seventh control signals B1 to B6, and the value of the first control signal B0 may be determined to be 0.

TABLE 1

|  | B6 | B5 | B4 | B3 | B2 | B1 | B0 |
|---|---|---|---|---|---|---|---|
| Code Shift Deactivation | 0 | 1 | 0 | 1 | 1 | 0 | 1 |
| Code Shift Activation | 1 | 0 | 1 | 1 | 0 | 1 | 0 |

The resistance values of the transistors disposed in each of the first to seventh current paths are different from each other, and therefore, the amount of current provided by each of the first to seventh current paths may be different from each other. For example, when the on-resistance of the first transistor TR1 in the turn-on state is defined as R0, the resistance value of the third current path is R0, the resistance value of the second current path is 2*R0, and a resistance value of the first current path may be 4*R0.

As described above with reference to FIG. 5, the second transistor TR2 may have an aspect ratio twice as large as that of the first transistor TR1, and the third transistor TR3 may have an aspect ratio four times greater than that of the first transistor TR1. Also, the fourth transistor TR4 may have an aspect ratio eight times greater than that of the first transistor TR1, and the fifth transistor TR5 may have an aspect ratio sixteen times greater than that of the first transistor TR1. Therefore, the resistance value of the fourth current path may be R0/2, the resistance value of the fifth current path may be R0/4, the resistance value of the sixth current path may be R0/8, and the resistance value of the seventh current path may be R0/16.

As illustrated in Table 1, if the pull-up control code is [101011], the resistance value of the pull-up unit circuit 300 may be determined to be 4*R0/53 in the example embodiment of FIG. 9 in which code shift is disabled. On the other hand, in the example embodiment of FIG. 10 in which the code shift is activated, the resistance value of the pull-up unit circuit 300 may be determined as 2*R0/53. In detail, by inputting a shift code obtained by applying a 1-bit code shift to a pull-up control code to the pull-up unit circuit 300, the resistance value of the pull-up unit circuit 300 may be reduced by half.

By increasing the number of bits capable of code shifting, it is possible to further reduce the resistance value of the pull-up unit circuit 300. For example, in the pull-up unit circuit 300, an eighth current path having a resistance value of R0/32 may be connected in parallel with the first to seventh current paths, and a 2-bit code shift is applied to the pull-up control code. When a 2-bit code shift is applied, the resistance value of the pull-up unit circuit 300 may be reduced by ¼ to R0/53. However, this is a theoretical value, and as the number of bits of the code shift applied to the pull-up control code increases, a resistance mismatch problem in which the actual resistance value of the pull-up unit circuit 300 is smaller than the target resistance value may occur.

Therefore, in example embodiments, the control range of the resistance value of the pull-up circuit is limited by limiting the number of code-shiftable bits of the pull-up control code and connecting a plurality of pull-up unit circuits in parallel with each other, and at the same time, resistance mismatch may be resolved. Hereinafter, it will be described in more detail with reference to FIG. 11.

Figure 11:
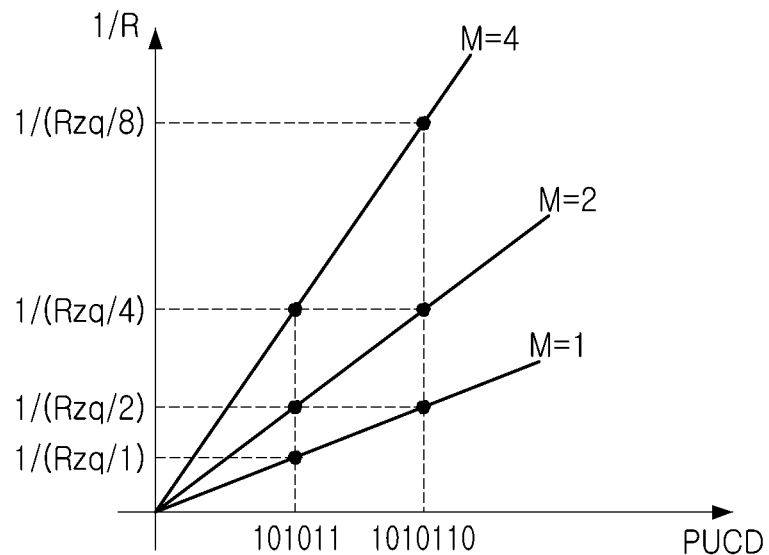
FIG. 11 is a diagram provided to describe an operation of a semiconductor device according to example embodiments.

FIG. 11 is a diagram illustrating the operation of a semiconductor device according to example embodiments.

In example embodiments described with reference to FIG. 11, a code shift of 1 bit may be applied to the pull-up control code (PUCD). Assuming that the pull-up control code PUCD is [101011], a shift code of [1010110] may be input to the pull-up circuit as the pull-up control code PUCD as code shift is activated.

On the other hand, in example embodiments described with reference to FIG. 11, four pull-up unit circuits connected to each other in parallel may be included in one pull-up circuit. Therefore, the controller of the semiconductor device changes the resistance of the pull-up circuit by determining whether the code shift is activated and the number of selected unit circuits that actually receive the pull-up control code (PUCD) among the pull-up unit circuits, the strength of the output signal may be adjusted. The configuration and control method of the pull-up circuit described with reference to FIG. 11 may be similarly applied to the pull-down circuit.

Referring to FIG. 11, after the ZQ calibration operation of the semiconductor device is completed, the pull-up control code (PUCD) is determined as [101011], and the pull-up control code (PUCD) of is input. The resistance of the pull-up circuit may be set to a basic resistance value (Rzq). The basic resistance value Rzq may vary depending on the type of semiconductor device. When the pull-up control code (PUCD) is input to the pull-up circuit, the output signal may be output with the basic strength.

On the other hand, the semiconductor device may adjust the resistance of the pull-up circuit to a value different from the basic resistance value Rzq to adjust the strength of the output signal. For example, the semiconductor device may change the resistance of the pull-up circuit to a value lower than the basic resistance value Rzq to increase the strength of the output signal.

When reducing the resistance of the pull-up circuit to ½ of the basic resistance value (Rzq), the controller of the semiconductor device adds 1 bit to the pull-up control code (PUCD) as described above with reference to FIG. 10. Code shifts may be applied. In this case, the number M of selected unit circuits operating by receiving the pull-up control code PUCD in the pull-up circuit may be one. As [1010110], a shift code to which a 1-bit code shift is applied, is input to one selected unit circuit, the resistance of the pull-up circuit may be reduced to ½ times the basic resistance value Rzq. Accordingly, the strength of the output signal may increase to a first strength, higher than the basic strength.

Also, in some embodiments, the controller may reduce the resistance of the pull-up circuit to ½ times the basic resistance value Rzq by increasing the number M of selected unit circuits to two. At this time, the pull-up control code (PUCD) of [101011] to which no code shift is applied may be input to the two selected unit circuits as it is. Since the resistance of each of the two selected unit circuits connected to each other in parallel is the basic resistance value Rzq, the resistance of the pull-up circuit may be reduced to ½ times the basic resistance value Rzq. Even in this case, the strength of the output signal may increase to the first strength.

When reducing the resistance of the pull-up circuit to ¼ times the basic resistance value (Rzq), the controller may increase the number of select unit circuits (M) to four. The pull-up control code (PUCD) of to which no code shift is applied may be input to the four selected unit circuits as it is. Since the resistance of each of the four selected unit circuits connected to each other in parallel is the basic resistance value Rzq, the resistance of the pull-up circuit may be changed to ¼ times the basic resistance value Rzq. In this manner, by inputting the pull-up control code PUCD to the four selected unit circuits, the strength of the output signal may be increased to a second strength, higher than the first strength.

On the other hand, when it is desired to increase the strength of the output signal to the second strength, the controller may determine the number M of selected unit circuits as two and input shift codes to which code shift is applied to the two selected unit circuits. The resistance of each of the two selected unit circuits may be set to ½ times the basic resistance value Rzq as a shift code of [1010110] to which a 1-bit code shift is applied is input. Accordingly, the resistance of the pull-up circuit may decrease to ¼ times the basic resistance value Rzq, and the strength of the output signal may increase to a second strength, higher than the first strength.

To reduce the resistance of the pull-up circuit to ⅛ times the basic resistance value (Rzq), the controller determines the number of selected unit circuits (M) to four, and may input a shift code to which code shift has been applied to the four selected unit circuits. Since the resistance of each of the four selected unit circuits is set to ½ times the basic resistance value (Rzq), the resistance of the pull-up circuit may be determined as ⅛ times the basic resistance value (Rzq). At this time, the strength of the output signal may increase to a third strength, higher than the second strength.

Figure 12:
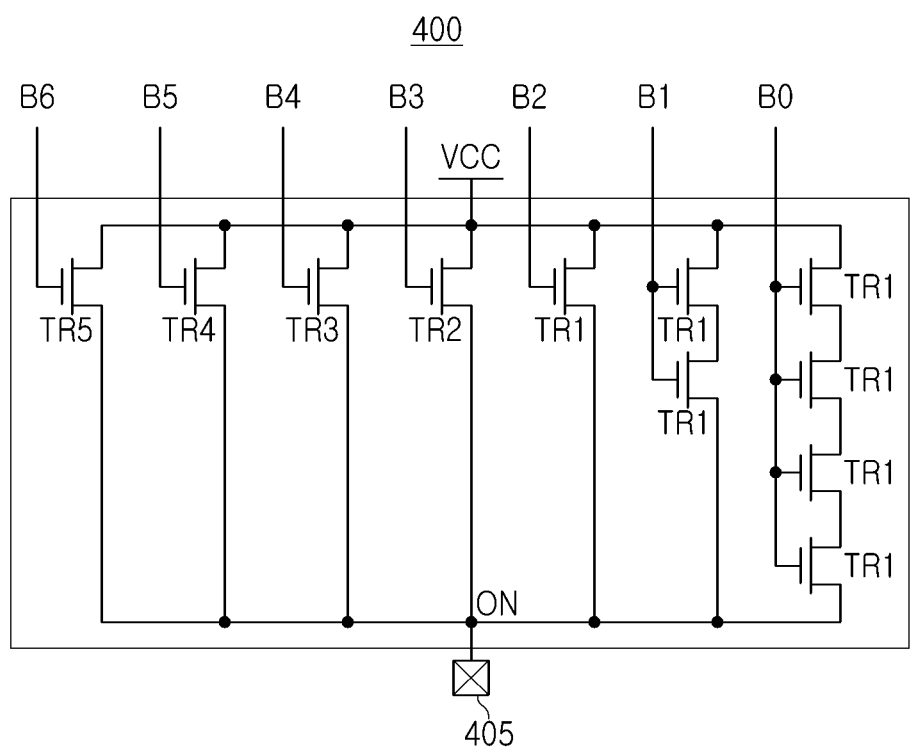
FIGS. 12 and 13 are diagrams illustrating the operation of a semiconductor device according to example embodiments.
Figure 13:
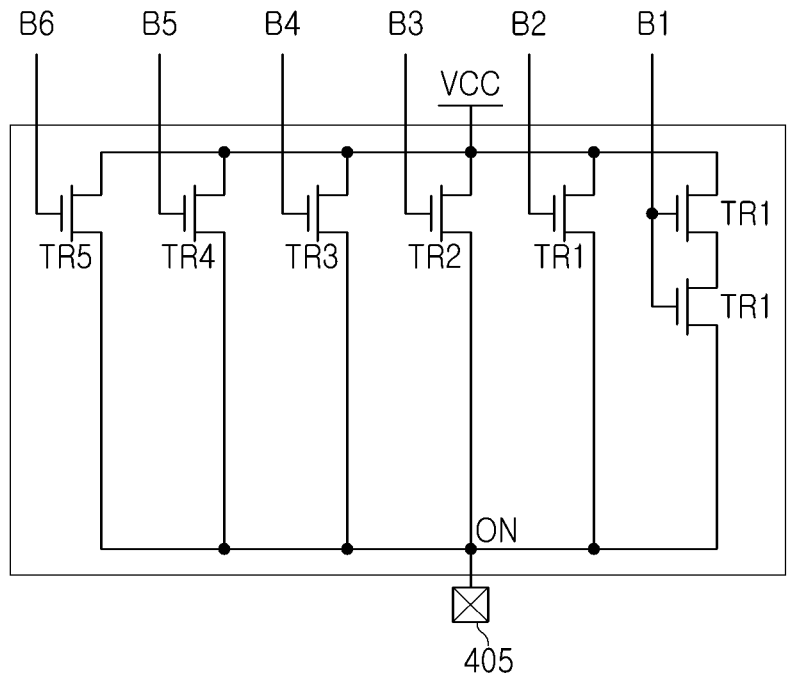

FIGS. 12 and 13 are diagrams illustrating the operation of a semiconductor device according to example embodiments.

FIGS. 12 and 13 are circuit diagrams illustrating unit circuits included in a pull-up circuit of a driver in a semiconductor device according to example embodiments. For example, in the pull-up circuit, a plurality of unit circuits may be connected to each other in parallel. FIG. 12 is a circuit diagram illustrating a first unit circuit 400 among a plurality of unit circuits. FIG. 13 is a circuit diagram illustrating a second unit circuit 410 different from the first unit circuit 400 among a plurality of unit circuits. In example embodiments described with reference to FIGS. 12 and 13, the pull-up control code input to the first unit circuit 400 and/or the second unit circuit 410 may include 6-bit data.

Referring to FIGS. 12 and 13, each of the first unit circuit 400 and the second unit circuit 410 may include a first power node supplying a first power supply voltage (VCC), and a plurality of switch elements TR1-TR5 connected between the output nodes (ON) to which the output pad 405 is connected. Referring to FIG. 12, the plurality of switch elements TR1 to TR5 included in the first unit circuit 400 may provide first to seventh current paths controlled by the first to seventh control signals B0 to B6. Therefore, if necessary, the controller of the semiconductor device may input a shift code obtained by applying a 1-bit code shift to the pull-up control code to the first unit circuit 400. As described above, the resistance value of the first unit circuit 400 to which the shift code is input may be ½ times the resistance value of the first unit circuit 400 to which the pull-up control code is input.

On the other hand, as illustrated in FIG. 13, the plurality of switch elements TR1 to TR5 included in the second unit circuit 410 may provide second to seventh current paths controlled by the second to seventh control signals B1 to B6. The second to seventh control signals B1 to B6 input to the second unit circuit 410 may be sequentially matched with six higher bits of the shift code excluding the least significant bit. In the code shift, since the least significant bit of the shift code is set to 0, as a result, the second to seventh control signals B1 to B6 may be matched with six bits included in the pull-up control code. For example, the second control signal B1 may be determined by the least significant bit of the pull-up control code, and the seventh control signal B6 may be determined by the most significant bit of the pull-up control code.

Comparing FIGS. 12 and 13, unlike the first unit circuit 400, the second unit circuit 410 may not include a current path provided by four first transistors TR1 connected to each other in series. Therefore, when the same pull-up control code is input, the resistance value of the second unit circuit 410 may be ½ times the resistance value of the first unit circuit 400.

In detail, the resistance value of the first unit circuit 400 to which the pull-up control code is input without code shift cannot be set in the second unit circuit 410. Therefore, in the example embodiments illustrated in FIGS. 12 and 13, to reduce the resistance value of the pull-up circuit to ½ times the basic resistance value determined by the ZQ calibration operation, the first unit circuit 400 uses a code shift. It is not possible to use a method of inputting a pull-up control code to each of first unit circuit 400 and second unit circuit 410, and a method of inputting a shift code to which code shift is applied to the first unit circuit 400 may be used. Operations of the first unit circuit 400 and the second unit circuit 410 will be described in more detail with reference to FIG. 14.

In the example embodiments described with reference to FIGS. 12 and 13, since the number of switch elements TR1 to TR5 included in the second unit circuit 410 is smaller than that of the first unit circuit 400, the overall input/output capacitance and circuit area of the pull-up circuit may be reduced. As an example, one unit circuit among a plurality of unit circuits included in the pull-up circuit is implemented as the first unit circuit 400, each of the remaining unit circuits is implemented as a second unit circuit 410, and the effect of reducing input/output capacitance and circuit area may be maximized or increased. However, according to some embodiments, two or more of the plurality of unit circuits may be implemented as the first unit circuit 400.

Figure 14:
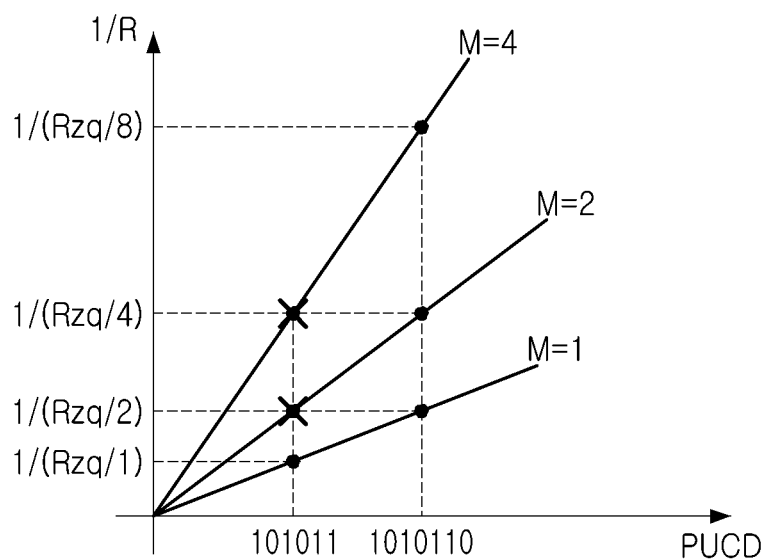
FIG. 14 is a diagram provided to describe an operation of a semiconductor device according to example embodiments.
Figure 15:
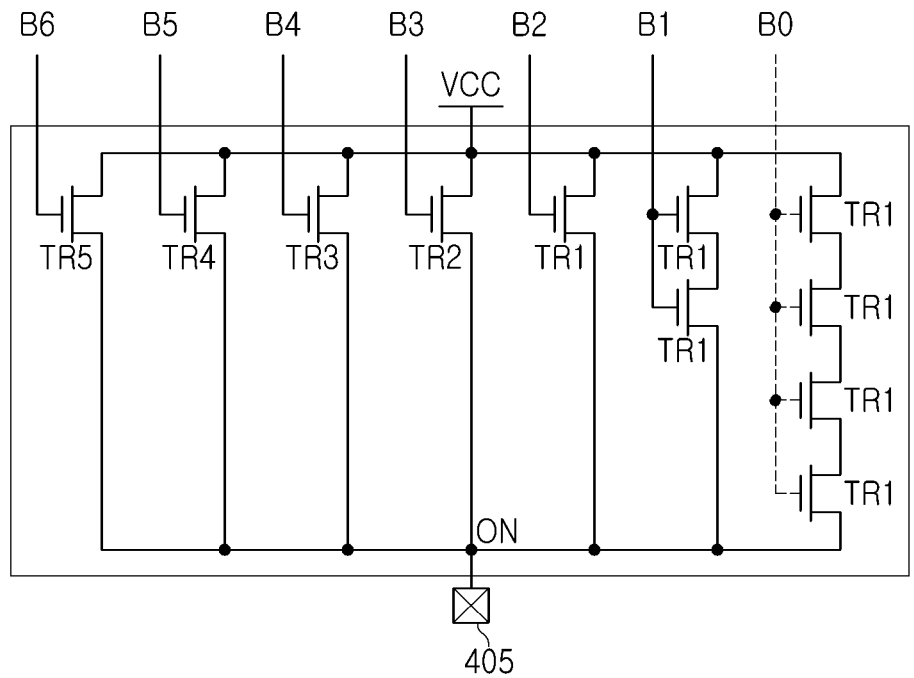
FIGS. 15 and 16 are diagrams illustrating the operation of a semiconductor device according to example embodiments.
Figure 16:
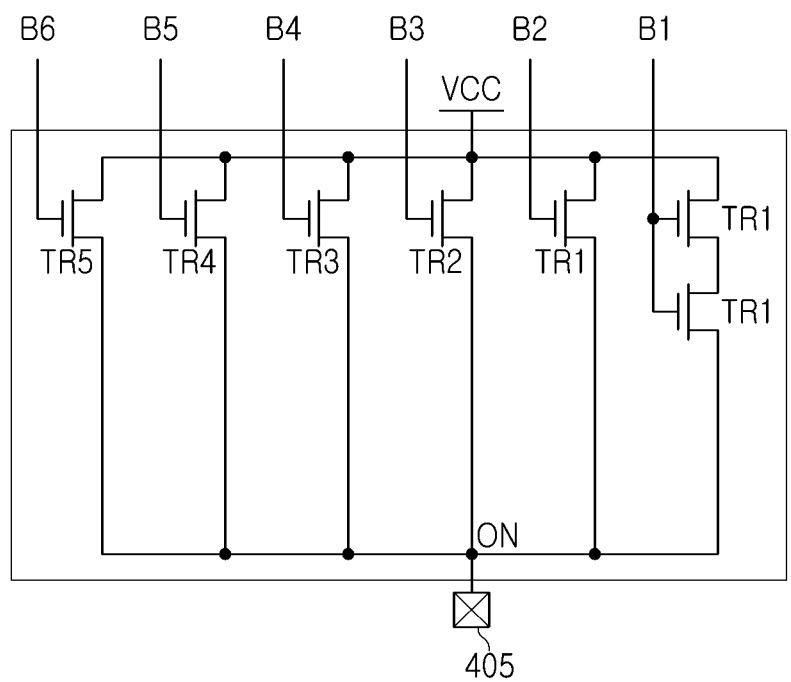

FIGS. 14 to 16 are diagrams illustrating the operation of a semiconductor device according to example embodiments.

In example embodiments described with reference to FIGS. 14 to 16, the controller of the semiconductor device may apply a 1-bit code shift to the pull-up control code (PUCD). Assuming that the pull-up control code (PUCD) is [101011], a shift code of [1010110] may be input to the pull-up circuit as a code shift is activated.

In example embodiments described with reference to FIG. 14, four pull-up unit circuits connected to each other in parallel may be included in one pull-up circuit. Among the four pull-up unit circuits, one pull-up unit circuit is implemented as the first unit circuit 400 illustrated in FIG. 12, and each of the remaining three pull-up unit circuits may be implemented as the second unit circuit 410 illustrated in FIG. 13. The configuration and control method of the pull-up circuit described with reference to FIG. 14 may be similarly applied to the pull-down circuit.

After the ZQ calibration operation of the semiconductor device is completed, the pull-up control code (PUCD) is determined as [101011]. The resistance of the pull-up circuit receiving the pull-up control code (PUCD) of [101011] may be set to a basic resistance value (Rzq). On the other hand, the controller of the semiconductor device may adjust the resistance of the pull-up circuit to a value different from the basic resistance value Rzq to adjust the strength of the output signal. For example, the controller may change the resistance of the pull-up circuit to a value lower than the basic resistance value (Rzq) to increase the strength of the output signal.

When the resistance of the pull-up circuit is set to the basic resistance value Rzq, the controller may input the pull-up control code PUCD determined in the ZQ calibration operation to the first unit circuit 400. On the other hand, to reduce the resistance of the pull-up circuit to ½ times the basic resistance value (Rzq), as illustrated in FIG. 15, the controller may input a shift code obtained by applying a 1-bit code shift to the pull-up control code PUCD to the first unit circuit 400.

In the example embodiments illustrated in FIG. 14, since three of the four unit circuits included in the pull-up circuit are implemented as the second unit circuit 410, an operation of setting the resistance of the pull-up circuit to ½ times the basic resistance value Rzq by directly inputting the pull-up control code PUCD to the two unit circuits cannot be implemented.

On the other hand, when reducing the resistance of the pull-up circuit to ¼ times the basic resistance value Rzq, the controller may increase the number M of the selected unit circuits to two. For example, the controller may input a shift code of [1010110] to each of the first unit circuit 400 and the second unit circuit 410. The number of second unit circuits 410 receiving shift codes may be one. At this time, as illustrated in FIG. 16, only six upper bits of the shift code excluding the least significant bit of the shift code may be input to the second unit circuit 410.

The resistance of each of the first unit circuit 400 and the second unit circuit 410 may be set to ½ times the basic resistance value Rzq as a shift code of [1010110] to which a 1-bit code shift is applied is input. Therefore, the resistance of the pull-up circuit may be reduced to ¼ times the basic resistance value (Rzq).

To reduce the resistance of the pull-up circuit to ⅛ times the basic resistance value (Rzq), the controller determines all of the first unit circuit 400 and the three second unit circuits 410 as selected unit circuits, and shift codes may be input to the four selected unit circuits. Since the resistance of each of the first unit circuit 400 and the three second unit circuits 410 is set to ½ times the basic resistance value Rzq by the shift code, the resistance of the pull-up circuit may be determined as ⅛ times the basic resistance value (Rzq).

FIGS. 17 to 20 are diagrams illustrating the operation of a semiconductor device according to example embodiments.

In the example embodiments illustrated in FIGS. 17 to 20, the driver of the semiconductor device may include a pull-up circuit 500. The pull-up circuit 500 may be connected between a first power node supplying the first power supply voltage VCC and an output node ON to which the output pad 505 is connected. The pull-up circuit 500 may include first to sixth unit circuits 510 to 560 connected to each other in parallel.

The first unit circuit 510 includes a plurality of switch elements TR1 to TR5, and the plurality of switch elements TR1 to TR5 may provide first to seventh current paths disposed in parallel. The plurality of switch elements TR1 to TR5 included in the first unit circuit 510 may be controlled by the first to seventh control signals B0 to B6.

On the other hand, the second unit circuit 520 includes a plurality of switch elements TR1 to TR5, and the plurality of switch elements TR1 to TR5 may provide second to seventh current paths disposed in parallel. Unlike the first unit circuit 510, the second unit circuit 520 may not provide a first current path in which the four first transistors TR1 are serially connected. The plurality of switch elements TR1 to TR5 included in the second unit circuit 520 may be controlled by the second to seventh control signals B1 to B6.

Each of the third to sixth unit circuits 530 to 560 may be implemented with the same circuit as the second unit circuit 520.

Figure 17:
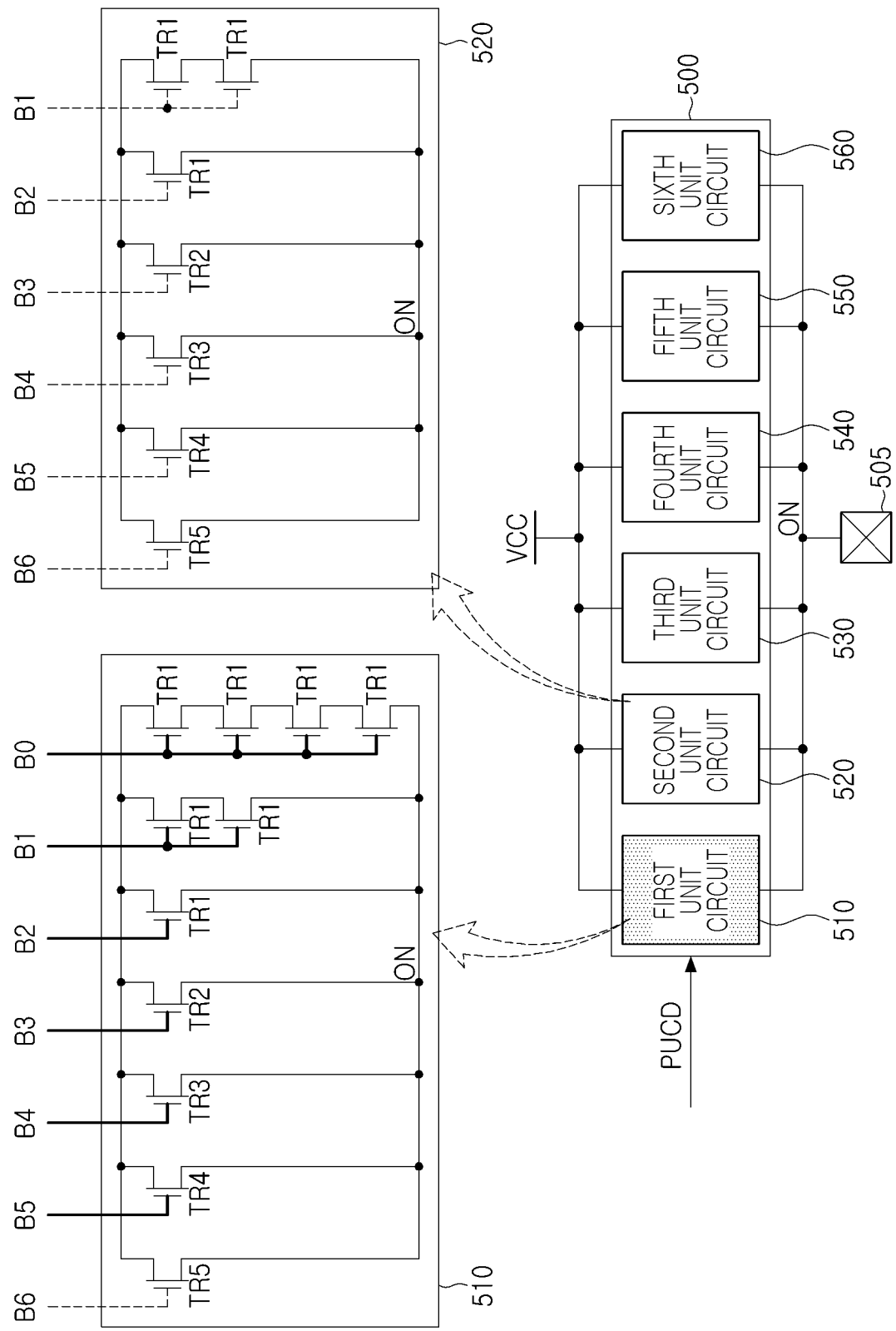
FIGS. 17 to 20 are diagrams provided to describe the operation of a semiconductor device according to example embodiments.

In the example embodiments illustrated in FIG. 17, the controller of the semiconductor device may set the resistance of the pull-up circuit 500 to a basic resistance value determined by the ZQ calibration operation. Referring to FIG. 17, the pull-up control code PUCD output from the controller may be input only to the first unit circuit 510 among the first to sixth unit circuits 510 to 560.

The pull-up control code (PUCD) contains 6 bits of data, and values of the first to sixth control signals B0 to B5 input to the first unit circuit 510 may be determined by six bits included in the pull-up control code PUCD. For example, the value of the first control signal B0 may be determined by the least significant bit of the pull-up control code PUCD, and the value of the sixth control signal B5 may be determined by the most significant bit. When the seventh control signal B6 is set to 0, the fifth transistor TR5 is turned off, and current may not flow through the seventh current path.

Figure 18:
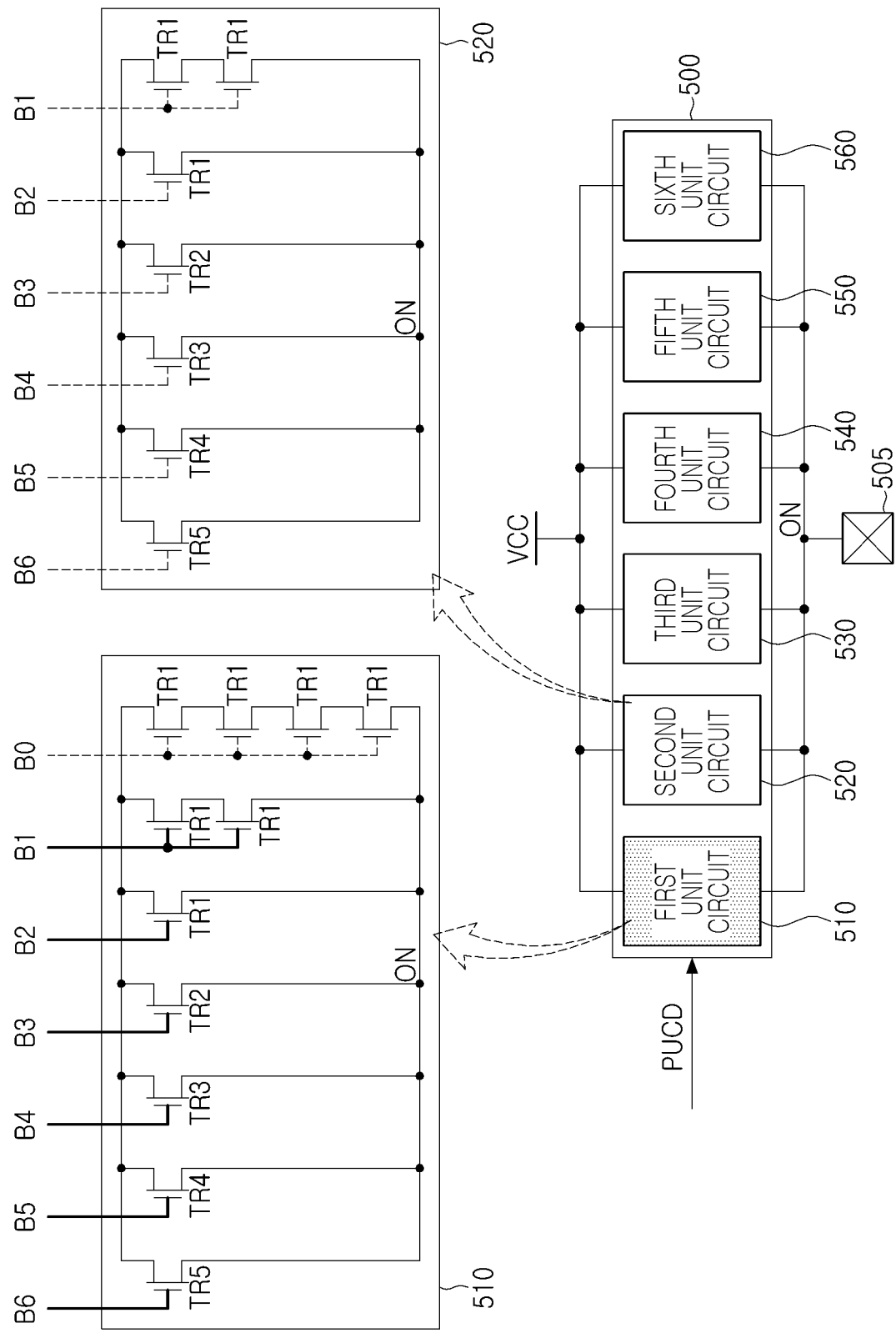

Next, referring to FIG. 18, the controller may input a shift code obtained by applying a 1-bit code shift to the pull-up control code (PUCD) to the first unit circuit 510. The shift code includes 7 bits of data, the upper six bits of the shift code match the six bits included in the pull-up control code (PUCD), and the least significant bit of the shift code may be set to 0.

As illustrated in FIG. 18, the four first transistors TR1 providing the first current path in the first unit circuit 510 may be turned off by the first control signal B0 corresponding to the least significant bit of the shift code. On the other hand, each of the second to seventh current paths may be controlled by the second to seventh control signals B1 to B6 determined by the upper six bits of the shift code. Therefore, as described above with reference to FIGS. 9 and 12, the resistance value of the first unit circuit 510 may be set to ½ times the basic resistance value determined in the ZQ calibration operation.

Figure 19:
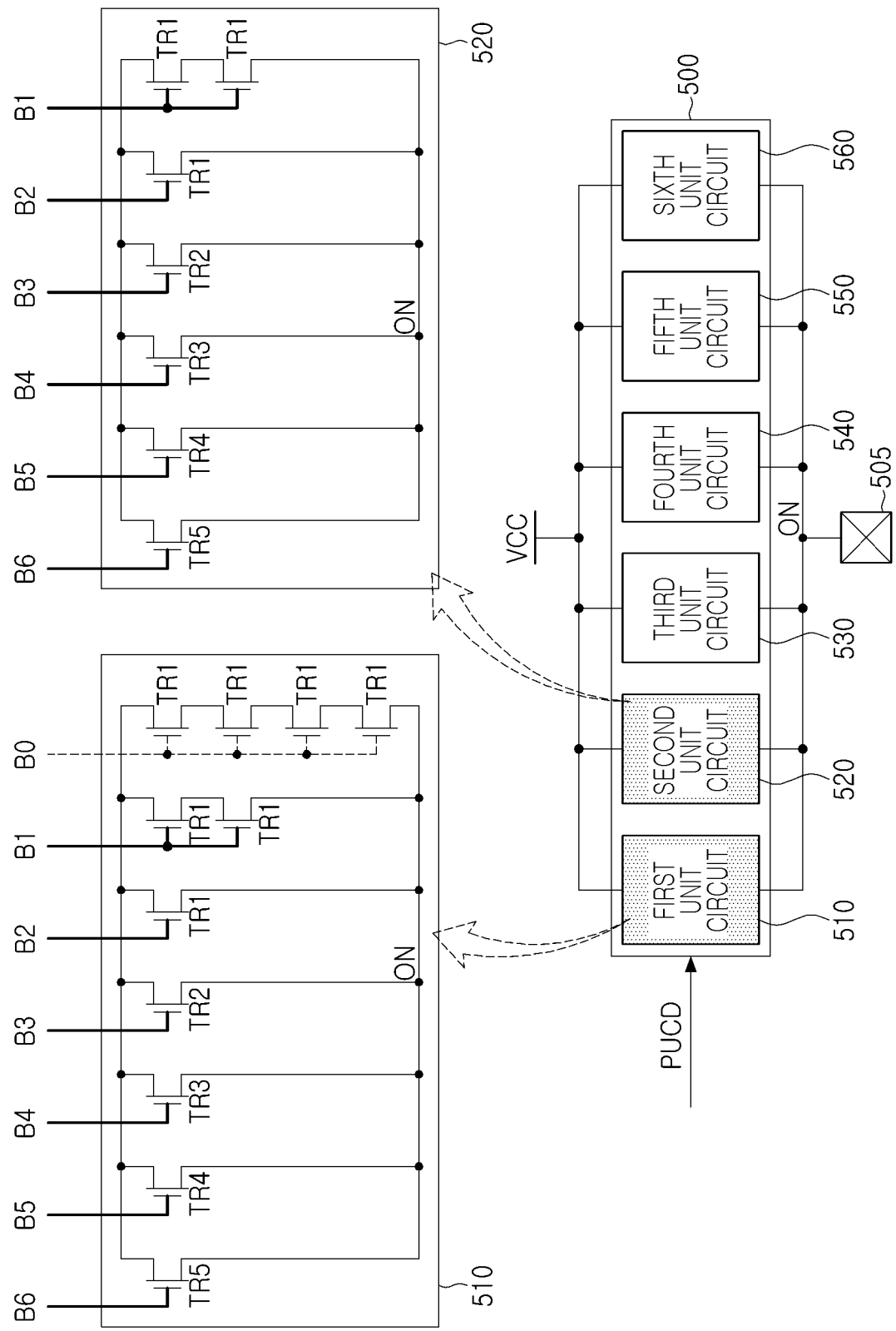

Next, referring to FIG. 19, the controller may input a shift code obtained by applying a 1-bit code shift to the pull-up control code PUCD to the first unit circuit 510 and the second unit circuit 520. As described above with reference to FIG. 18, the resistance value of the first unit circuit 510 may be set to ½ times the basic resistance value determined in the ZQ calibration operation.

Unlike the first unit circuit 510, the second unit circuit 520 may not include a first current path in which four first transistors TR1 are connected in series. Accordingly, the resistance value of the second unit circuit 520 may be ½ times the basic resistance value, the same as the resistance value of the first unit circuit 510 receiving the shift code. Therefore, in the example embodiments illustrated in FIG. 19, the resistance of the pull-up circuit 500 may be set to ¼ times the basic resistance value.

Figure 20:
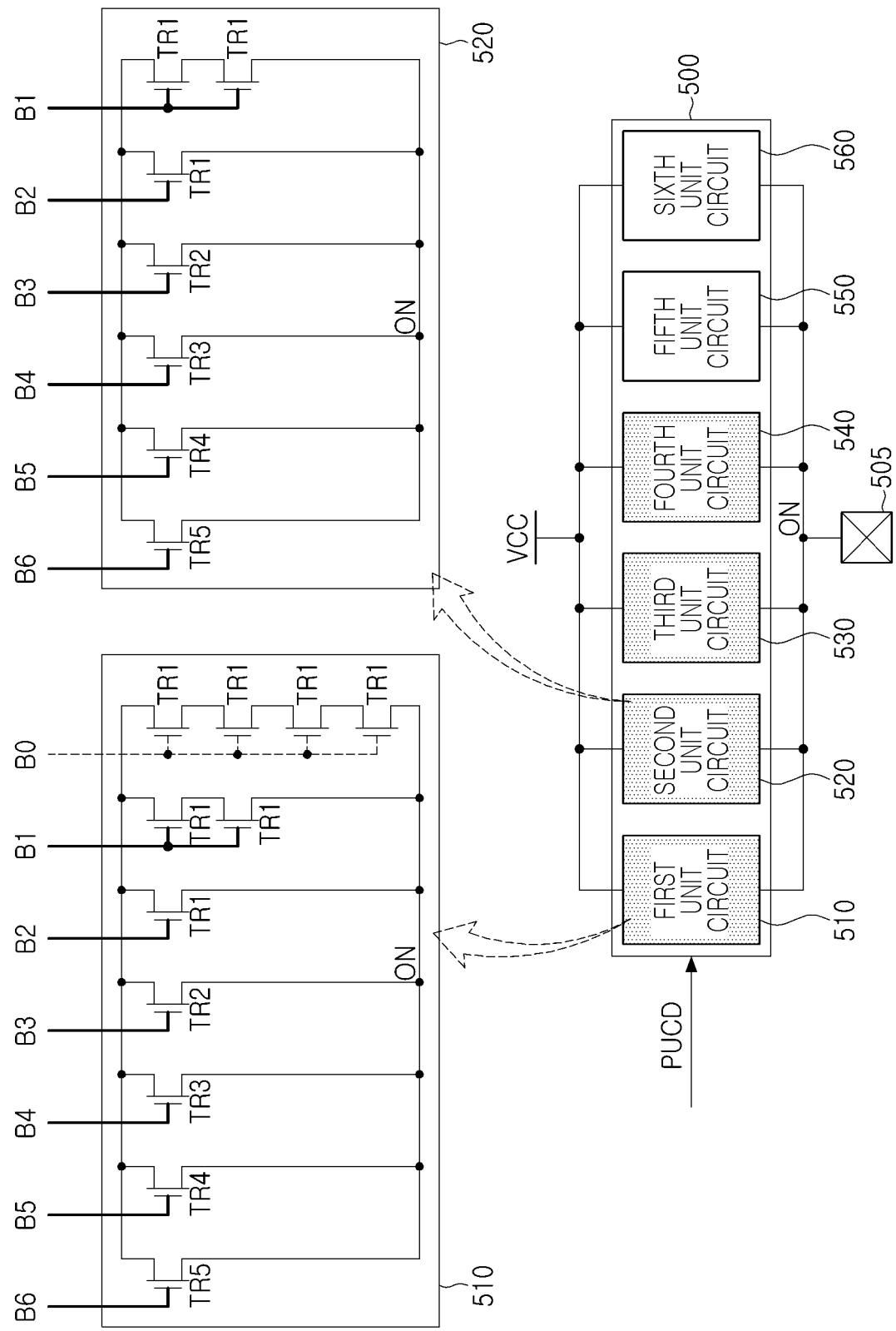

Referring to FIG. 20, the controller may input a shift code obtained by applying a 1-bit code shift to the pull-up control code (PUCD) to the first to fourth unit circuits 510 to 540. As described above with reference to FIG. 18, the resistance value of the first unit circuit 510 may be set to ½ times the basic resistance value determined in the ZQ calibration operation.

Unlike the first unit circuit 510, each of the second to fourth unit circuits 520 to 540 may not include a first current path in which four first transistors TR1 are connected in series. Accordingly, a resistance value of each of the second to fourth unit circuits 520 to 540 receiving the shift code may be the same as that of the first unit circuit 510 receiving the shift code. Therefore, in the example embodiments illustrated in FIG. 20, the resistance of the pull-up circuit 500 may be set to ⅛ times the basic resistance value.

In example embodiments described with reference to FIGS. 17 to 20, the first unit circuit 510 has a structure different from that of the second to sixth unit circuits 520 to 560, and therefore, a resistance value is determined using code shift. The adjusting operation may be applied only to the first unit circuit 510. However, since each of the second to sixth unit circuits 520 to 560 includes fewer transistors than the first unit circuit 510, not only may the circuit area of the pull-up circuit 500 be reduced, but also, the input/output capacitance acting as a load on the output pad 505 may also be reduced.

According to example embodiments, each of a plurality of unit circuits included in the driver includes a plurality of switch elements, and the plurality of switch elements may be turned on and off by a control code. The plurality of unit circuits may be connected to each other in parallel, and at least one of the plurality of unit circuits may be configured to receive a shift code obtained by code-shifting a control code. At this time, by appropriately limiting the number of bits for code-shifting the control code and the number of the plurality of unit circuits, a driver in which an increase in input/output capacitance and circuit area, and a resistance mismatch may be resolved at the same time, may be implemented.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
a first power node configured to supply a first power supply voltage;
an output node configured to output a signal to an output pad; and
a plurality of unit circuits electrically connected to the output node and electrically connected to each other in parallel between the first power node and the output pad,
wherein each of the plurality of unit circuits includes a plurality of switch elements that are configured to be turned on and turned off responsive to an N-bit control code, where N is a natural number equal to or greater than 2, and at least two of the plurality of switch elements are electrically connected to each other in parallel between the first power node and the output pad,
wherein a first unit circuit of the plurality of unit circuits comprises at least a plurality of first switch elements electrically connected to each other in parallel to provide N+1 current paths between the first power node and the output node,
wherein a first current path of the N+1 current paths is configured to have a smallest current to flow, and the (N+1)th current path is configured to have a largest current to flow, and
wherein while the signal is output by the output node, at least one of the first current path and the (N+1)th current paths in the first unit circuit is blocked.

2. The semiconductor device of claim 1, wherein the plurality of unit circuits are respectively configured to provide the N+1 current paths between the first power node and the output node.

3. The semiconductor device of claim 2, wherein a same number of the plurality of switch elements is included in each of the plurality of unit circuits.

4. The semiconductor device of claim 1, wherein remaining ones of the plurality of unit circuits other than the first unit circuit, are configured to provide N current paths between the first power node and the output node.

5. The semiconductor device of claim 4, wherein a number of the plurality of switch elements included in each of the remaining ones of the plurality of unit circuits is less than a number of the plurality of switch elements included in the first unit circuit.

6. The semiconductor device of claim 5, wherein respective differences between the number of the plurality of switch elements included in each of the remaining ones of the plurality of unit circuits and the number of the plurality of switch elements included in the first unit circuit is 2 or more.

7. The semiconductor device of claim 1, wherein N is 6, and
wherein the plurality of first switch elements included in the first unit circuit are configured to provide the first current path and are electrically connected to each other in series, two or more second switch elements included in the first unit circuit are configured to provide a second current path and are electrically connected to each other in series, a third switch element is configured to provide a third current path, a fourth switch element is configured to provide a fourth current path, a fifth switch element is configured to provide a fifth current path, a sixth switch element is configured to provide a sixth current path, and a seventh switch element is configured to provide a seventh current path.

8. The semiconductor device of claim 7, wherein the plurality of first switch elements, the two or more second switch elements, and the third switch element each have a first aspect ratio, the fourth switch element has a second aspect ratio that is twice the first aspect ratio, the fifth switch element has a third aspect ratio that is twice the second aspect ratio, the sixth switch element has a fourth aspect ratio that is twice the third aspect ratio, and the seventh switch element has a fifth aspect ratio that is twice the fourth aspect ratio.

9. The semiconductor device of claim 7, wherein when the seventh switch element is turned on, the first switch elements are turned off.

10. The semiconductor device of claim 7, wherein a number of the first switch elements is greater than a number of the second switch elements.

11. A semiconductor device comprising:
a pull-up circuit electrically connected between a first power node that is configured to supply a first power supply voltage and an output node that is configured to output a signal;
a pull-down circuit electrically connected between a second power node that is configured to supply a second power supply voltage lower than the first power supply voltage and the output node; and
a controller configured to output an N-bit control code to the pull-up circuit and the pull-down circuit, where N is a natural number greater than or equal to 2,
wherein the pull-up circuit includes a plurality of pull-up unit circuits electrically connected to each other in parallel between the first power node and the output node,
wherein the controller is configured to output the N-bit control code or a shift code obtained by code-shifting the N-bit control code to a first pull-up unit circuit among the plurality of pull-up unit circuits, and wherein the controller is configured to output an N−1 bit correction control code that is obtained by removing a least significant bit from the N-bit control code or is configured to output the N-bit control code to at least one second pull-up unit circuit different from the first pull-up unit circuit.

12. The semiconductor device of claim 11, wherein each of the plurality of pull-up unit circuits includes a plurality of switch elements, wherein a number of the plurality of switch elements included in the first pull-up unit circuit is greater than a number of the plurality of switch elements included in the at least one second pull-up unit circuit.

13. The semiconductor device of claim 12, wherein each of the plurality of switch elements is an NMOS transistor.

14. The semiconductor device of claim 11, wherein the controller is configured to output the shift code, but not the N-bit control code, to the first pull-up unit circuit to increase strength of the signal from a predetermined basic strength to a first strength that is greater than the predetermined basic strength.

15. The semiconductor device of claim 14, wherein the controller is configured to logically multiply N bits included in the N-bit control code by 1 bit and configured to logically add a least significant bit to 0, to generate the shift code.

16. The semiconductor device of claim 14, wherein the controller is configured to output the N-bit control code to the second pull-up unit circuit to increase the strength of the signal from the first strength to a second strength that is greater than the first strength.

17. The semiconductor device of claim 11, wherein the controller is configured to output the N-bit control code to the first pull-up unit circuit and configured to output the N−1 bit correction control code to the second pull-up unit circuit to increase strength of the signal from a predetermined basic strength to a first strength that is greater than the predetermined basic strength.

18. The semiconductor device of claim 17, wherein the controller is configured to output the shift code to the first pull-up unit circuit to increase the strength of the signal from the first strength to a second strength that is greater than the first strength.

19. A semiconductor device comprising:

a pull-up circuit electrically connected between a first power node that is configured to supply a first power supply voltage and an output node configured to output a signal; and a controller configured to output an N-bit pull-up control code to the pull-up circuit, wherein N is a natural number equal to or greater than 2, wherein the pull-up circuit includes a plurality of unit circuits electrically connected to each other in parallel between the first power node and the output node, and wherein the plurality of unit circuits include a first unit circuit and a second unit circuit, and a number of N+1 current paths provided by the first unit circuit between the first power node and the output node is different from a number of current paths provided by the second unit circuit between the first power node and the output node, wherein the first unit circuit of the plurality of unit circuits comprises at least a plurality of switch elements electrically connected to each other in parallel to provide the N+1 current paths between the first power node and the output node, wherein a first current path of the N+1 current paths is configured to have a smallest current to flow, and the (N+1)th current path is configured to have a largest current to flow, and wherein while the signal is output by the output node, at least one of the (N+1)th current paths and the first current path in the first unit circuit are blocked.

20. The semiconductor device of claim 19, wherein a number of the plurality of switch elements included in the first unit circuit is different from a number of the plurality of switch elements included in the second unit circuit.

* * * * *